United States Patent [19]

Chen

[11] Patent Number: 5,707,765
[45] Date of Patent: Jan. 13, 1998

[54] PHOTOLITHOGRAPHY MASK USING SERIFS AND METHOD THEREOF

[75] Inventor: J. Fung Chen, Cupertino, Calif.

[73] Assignee: Microunity Systems Engineering, Inc., Sunnyvale, Calif.

[21] Appl. No.: 654,459

[22] Filed: May 28, 1996

[51] Int. Cl.$^6$ .................................................. G03F 9/00
[52] U.S. Cl. ............................... 430/5; 430/296; 430/313
[58] Field of Search ................................ 430/5, 311, 313, 430/314, 296; 378/34, 35

[56] References Cited

U.S. PATENT DOCUMENTS

| | | |
|---|---|---|
| 4,591,540 | 5/1986 | Bohlen et al. . |
| 4,895,780 | 1/1990 | Nissan-Cohen et al. . |
| 5,128,738 | 7/1992 | Lee et al. . |
| 5,242,770 | 9/1993 | Chen et al. . |
| 5,256,505 | 10/1993 | Chen et al. . |
| 5,340,700 | 8/1994 | Chen et al. . |

OTHER PUBLICATIONS

Chien, Paul et al.; "Proximity Effects in Submicron Optical Lithography," pp. 35–39, SPIE vol. 772 Optical Microlithography VI Mar. 1987.

Rosenbluth, Alan E. et al.; "A Critical Examination of Submicron Optical Lithography Using Simulated Projection Images," pp. 1190–1195, J. Vac. Sci. Technol. B., vol. 1 No. 4, Oct.–Dec. 1983.

Nissan–Cohen, Y. et al.; "Variable Proximity Corrections for Submicron Optical Lithographic Masks," pp. 13–14, Proc. 1987 Symp. VLSI Tech. (Mar. 1987).

Meyerhofer, Dietrich; "Resolution and Proximity Effect in Optical Lithography," pp. 174–187, SPIE vol. 922 Optical/Laser Microlithography (Feb. 1988).

Shamma, Nader et al.; "A Method for Correction of Proximity Effect in Optical Projection Lithography," pp. 145–156, Proc. KTI Interface (Mar. 1989).

Liu, Albert C. et al.; "A Study of Projected Optical Images for Typical IC Mask Patterns Illuminated by Partially Coherent Light," pp. 1251–1263, IEEE Transactions on Electron Devices, vol. ED-30, No. 10, Oct. 1983.

Maxwell, Graeme D.; "An Analysis of the Relevance to Linewidth Control of Various Aerial Image Characteristics," pp. 213–223, SPIE vol. 633 Optical Microlithography V (May 1986).

Ong, Edith et al.: "Comparison of Proximity Effects in Contrast Enhancement Layer and Bi–Layer Resist Processes," pp. 443–448, J. Vac. Sci. Technol. B5(1), Jan./Feb. 1987.

Flanner III, Philip D. et al.: "Two–Dimensional Optical Proximity Effects," pp. 239–244, SPIE vol. 633 Optical Microlithography V (Mar. 1986).

Dunbrack, Steve K.; "Masks for Sub–0.5 micron Optical Lithography," pp. 2–8, SPIE vol. 922 Optical/Laser Microlithography (May 1988).

(List continued on next page.)

*Primary Examiner*—S. Rosasco
*Attorney, Agent, or Firm*—McDermott, Will & Emery

[57] ABSTRACT

There is disclosed a photolithography mask and method of making the same that utilizes serifs to increase the correspondence between an actual circuit design and the final circuit pattern on a semiconductor wafer. The mask uses a plurality of serifs having a size determined by a resolution limit of the optical exposure tool used during the fabrication process. The serifs are positioned on the corner regions of the mask such that a portion of surface area for each of the serifs overlaps the corner regions of the mask. The size of the serifs is about one-third the resolution limit of said optical exposure tool. About 33 to about 40 percent of the total surface area of the serifs overlap the corner regions of the mask.

18 Claims, 6 Drawing Sheets

OTHER PUBLICATIONS

Wolf, T.M. et al.; "Proximity Effects of Lithography and Etching in Submicron Processes," pp. 335–349, Proc. KTI Interface (Apr. 1989).

White, L.K.; "Contact Hole Imaging in Stepper Lithography," pp. 1–8, SPIE vol. 733 Optical Lithography VI (Feb. 1987).

Ito et al.; "Submicrometer Pattern Correction for Optical Lithography," pp. 9–17, SPIE vol. 922 Optical/Laser Microlithography (Jun. 1988).

Starikov, A.; "Use of a Single Size Square Serif for Variable Print Bias Compensation in Microlithography: Method, Design, and Practice," pp. 34–46, SPIE vol. 1088 Optical/Laser Microlithography (May 1989).

Cobb, N. et al.: "Fast, Low–Complexity Mask Design," pp. 313–327, SPIE vol. 2440 (Mar. 1995).

Sugawara, M. et al.; "Practical Evaluation of Optical Proximity Effect Correction by EDM Methodology," pp. 207–219, SPIE vol. 2440 (Feb. 1995).

PHOTOLITHOGRAPHY MASK USING SERIFS AND METHOD THEREOF

BACKGROUND OF THE INVENTION

1. Field of the Invention

The present invention is directed to a photolithography mask and a method for forming a photolithography mask for use in manufacturing semiconductor devices, and more particularly to a mask and method utilizing serifs to increase the correspondence between the actual circuit design and the final circuit pattern on the semiconductor wafer.

2. Description of the Related Art

When fabricating semiconductor devices, photolithographic masks are used to transfer circuitry patterns to silicon wafers to create integrated circuits. Photolithographic masks consist of geometric patterns corresponding to the circuit components to be integrated onto a silicon wafer. The patterns used to create such masks are done through CAD (computer-aided design) programs. Each mask is used to transfer its corresponding pattern to a photosensitive layer of material (a "photoresist") deposited on a silicon wafer. The transfer of the mask pattern to the photoresist is typically done by an optical exposure tool, which directs light or radiation through the mask to the photoresist.

Most CAD programs follow a set of predetermined design rules in order to create functional masks. These rules are set by processing and design limitations. For example, design rules define the space tolerance between devices or interconnect lines, so as to ensure that the devices or lines do not interact with one another in an undesirable way.

These design rule limitations are typically referred to as "critical dimensions" (CD). A critical dimension of a circuit is defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD of its corresponding mask pattern approaches the resolution limit of the optical exposure tool. The resolution for an exposure tool is defined as the minimum feature that the exposure tool can repeatedly expose on the wafer. The resolution value of present exposure equipment often represents the CD for many advanced IC circuit designs.

As the critical dimensions of the circuit layout become smaller and approach the resolution value of the exposure tool, the correspondence between the mask pattern and the actual circuit pattern developed on the photoresist layer is significantly reduced. The degree and amount of differences in the mask and actual circuit patterns depends on the proximity of the circuit features to one another.

Accordingly, pattern transference problems are referred to as "proximity effects." Proximity effects occur when very closely spaced circuit pattern features are lithographically transferred to a resist layer on a wafer. The light waves of the closely spaced circuit features interact, thereby distorting the final transferred pattern features.

Another common proximity effect problem caused by approaching the resolution limit of the exposure tool is that the corners of the photoresist (both concave and convex) tend to overexpose or underexpose due to a concentration or lack of energy at each of the corners. For example, during exposure to light or radiation the photoresist layer integrates energy contributions from all surrounding areas. Thus, the exposure dose in one vicinity of the wafer is affected by the exposure dose in neighboring vicinities.

Because a corner region in a mask pattern lacks neighboring regions, the exposure dose to a corner of the photoresist layer will always be less than the exposure dose to the main body of the layer. The corners of the developed photoresist pattern, therefore, tend to be rounded, rather than angular, due to the fact that less energy has been delivered to the corners than to the other areas of the masked pattern. In small, dense integrated circuits, such as VLSI, these rounding effects can cause a significant degradation to the circuit's performance. Moreover, rounding results in a loss of wafer surface area, which correspondingly reduces the total area available for conduction and accordingly results in an undesirable increase in contact resistance.

To help overcome the significant problem of proximity effects, a number of techniques are used to add sub-lithographic features to mask patterns. Sub-lithographic features have dimensions less than the resolution of the exposure tool, and therefore do not transfer to the photoresist layer. Instead, sub-lithographic features interact with the original mask pattern and compensate for proximity effects, thereby improving the final transferred circuit pattern.

Examples of such sub-lithographic features are scattering bars and anti-scattering bars, which are added to mask patterns to reduce differences between features within a mask pattern caused by proximity effects. Another technique used to improve circuit pattern transference from design to wafer is to add features to the mask pattern called "serifs." Serifs are typically sub-lithographic square-shaped features positioned on each corner of a mask. The serifs serve to "sharpen" the corners in the final transferred design on the wafer, thereby improving the correspondence between the actual circuit design and the final transferred circuit pattern on the photoresist layer. Serifs are also used at the intersection areas of differing circuit patterns in order to compensate for the distortion factor caused by the intersection of two different circuit patterns.

FIGS. 1A–1C depict, in simplified form, the problem to which serifs are directed. FIG. 1A shows the basic shape of a circuit design (represented as a square). The square design of FIG. 1A has sharply defined corner borders. A typical mask pattern (without sub-lithographic features) based on the circuit design of FIG. 1A is shown in FIG. 1B. Due to the fact that there is always an unavoidable amount of degradation during circuit modulation, some of the corner resolution of the circuit design is lost, resulting in a mask having slightly rounded corners. Thus, when the mask pattern is ultimately transferred to the silicon wafer, the cumulative effects of the loss of resolution while forming the mask pattern and the proximity effects caused by the resolution limits of the exposure tool result in a final transferred circuit design to the wafer that is essentially oval in shape (FIG. 1C). Accordingly, the correspondence between the original circuit design and the final photoresist pattern is greatly reduced.

It is apparent that the negative impact of corner rounding is the loss of chip area. For example, an original circuit pattern has a square shape. The square pattern uses a minimum CD design rule. That is, the CD represents the size of each side of the square. After the pattern is transferred to a photoresist, the pattern takes on a rounded shape. This is shown in FIGS. 1A–1C. From an intended square shape to a final rounded pattern, it is estimated that the loss of area is about 20–22 percent for a 0.5 μm design rule. This is a very significant amount of error.

It has been determined that the corner rounding effect is the result of the interaction between the exposure tool and the photoresist process. Even assuming that the modulation loss from the design to the mask is at a minimum, the resolution of the mask is still well beyond the resolution limit of the exposure tool.

FIGS. 2A and 2B depict the corner rounding concept. In FIG. 2A, the mask 10 and resist feature 12 are depicted. The value "d" corresponds to the resolution limit of a given photolithography process. Mathematically, the resolution limit for a lithographic process (including the exposure tool and the photoresist process) may be expressed by a Rayleigh criteria, as depicted below:

$$\text{resolution limit} = k \, (\text{Lambda}/\text{NA})$$

wherein Lambda is the wavelength of the exposure radiation, "NA" represents the numerical aperture of the imaging optics, and "k" is the capability of the photoresist process. A typical production photoresist process is assumed to be 0.7.

The above formula is normally used to describe the minimum resolvable separation between two feature edges. This formula may also be used to explain the corner rounding effect. For example, if (in FIG. 2A):

$$d = \text{resolution limit} = k \, (\text{Lambda}/\text{NA})$$

then any diagonal line drawn from b to c at the corner area will become the sub-resolution region. That is, they are not resolvable. Thus, due to the resolution limit, there is no way for any typical lithography process to faithfully reproduce the corners.

One approach to solving the problem of corner rounding (aside from the use of serifs) is to enlarge the "d," or resolution limit. Enlarging the "d" requires "biasing up" the critical dimension. This means that the actual size of the critical dimension must be increased, as shown in FIG. 2B. This approach has become common in the semiconductor industry, because it is relatively simple to implement. The penalty for using this method, however, is that it consumes a greater amount of chip real estate, and therefore a bigger circuit die size is necessary. Moreover, this method does not "solve" the problem of corner rounding; it merely attempts to hide corner rounding effects.

FIGS. 3A and 3B depict another method of addressing the corner rounding problem. This method involves arbitrarily extending the size of the end line feature. FIG. 3A depicts a typical end line feature 14. FIG. 3B shows an arbitrary extension thereof, using a so-called "hammer hat" style of bias 16. The purpose of this technique is to make the end line feature bigger so that it has better printability. The problem, however, is the same; the hammer hat feature occupies extra chip space. Thus, one needs to allow more room for the adjacent feature to avoid a violation of the critical dimension rule for the designated process.

Serifs were designed in an attempt to overcome the problem of corner rounding during circuit fabrication and improve the correspondence between the original circuit design and the final photoresist layout. In the past, computer simulation tools (such as CADs) for lithography processes were of questionable accuracy, and such tools were not readily available. Thus, although it was known that serifs could be used, their application was limited. The serif technique employed was simply to add an arbitrarily sized serif to the main feature in the hope that some improvement would be seen over the uncorrected feature. Such improvements, however, were disappointing compared to the expected results.

In contrast to using arbitrarily sized serifs, a recent approach disclosed in N. Cobb et al., *Fast, Low-Complexity Mask Design*, SPIE Vol. 2440, 313–327 (1995) is to use computer-aided design in an attempt to correct all feature corners of a complex circuit design. FIGS. 4A and 4B depict a complex circuit design and a corresponding mask using this technique, respectively. If a mask can be realistically made with these pre-corrected features, the results are expected to be much better than uncorrected masks.

The correction computation required for this technique, however, is not practical at this time. The technique requires first calculating the aerial image in small, segment-by-segment areas. Regardless of how efficient the algorithm is, the computations will be complicated and intensive. For example, for several hundred microns of circuit area, the computations required would take most of a day. For a realistic VLSI circuit, the size of a die is on the order of 10 to 20 mm on just a single side. Thus, this type of computational-intensive methodology will not be ready for practical applications anytime soon.

Yet another type of correction method disclosed in M. Sugawara et al., *Practical Evaluation of Optical Proximity Effect Correction by EDM Methodology*, SPIE Vol. 2440, pp. 207–219 (1995) requires predetermining the actual lithographic process latitude in terms of the focus and exposure window of the photo-resist process. Once the information is determined and fixed, the computation software takes into account the image intensity to calculate the needed correction region of the feature. Thus, this method can aggressively correct the feature end line with a progressive series of serifs.

There are shortcomings with this approach as well. First, it is a fixed method. That is, if the process is changed, i.e., a new exposure tool is used or a new type of photoresist, the correction method will have to be re-done and a new mask made. Moreover, the progressive series of serifs are done over very minute increments. These small increments can go beyond the limitations of the conventional methods for making a mask. Thus, it is unlikely that this method will obtain practical use, unless the complexity of the serif correction steps are drastically reduced.

SUMMARY OF THE OBJECTS

It is therefore an object of the present invention to provide a method of utilizing serifs in integrated circuit fabrication that improves the correspondence between the original circuit design and the transferred photoresist pattern over heretofore known methods.

It is another object of the present invention to provide a photolithographic mask having serifs which improve the correspondence between the original circuit design and the transferred photoresist pattern.

It is another object of the present invention to increase the effectiveness of serifs when forming photolithographic masks.

Still another object of the present invention is to create a serif design that is easily reproducible when forming a mask pattern while still providing greater corner sharpening over prior serif techniques.

The present invention, including all attendant features and advantages, will be best understood by reference to the following detailed description of the invention, taken in conjunction with the accompanying drawings.

DETAILED DESCRIPTION OF THE DRAWINGS

The present invention is directed to a photolithographic mask and a method thereof that uses serifs such that the correspondence between the original circuit design and the final photoresist pattern on the wafer is greatly increased over known serif techniques.

It has been determined that, in order to maximize the effectiveness of serifs in countering proximity effects, the size of the serif to be used is determined by the resolution of the optical exposure tool. In accordance with the present invention, the size of the serif should be about one-third the resolution of the exposure tool. For example, the resolution for some commercial exposure tools presently available is about 0.45 microns. The size of the serif to be used, therefore, should be about one-third of 0.45 microns, or about 0.15 microns.

Another critical factor in maximizing the effectiveness of serifs is the placement of the serif over the mask circuit pattern. According to the present invention, the serif should be placed on the corners of the mask pattern in such a way that about 33 to about 40 percent of the total surface area of the serif overlaps the mask pattern. Continuing with the example above, therefore, if the total size of the serif is about 0.15 microns, the amount of serif surface area overlap on the corners of the mask pattern should be about 0.05 to about 0.06 microns (i.e., about 33 to about 40 percent the total surface area of the serif).

Figure 1A:
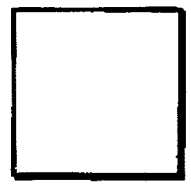
FIGS. 1A–1C show a typical progression from circuit design to mask pattern to final wafer product.
Figure 1B:
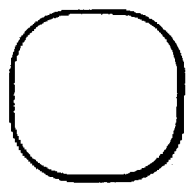
Figure 1C:
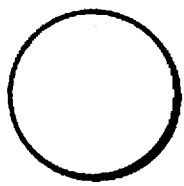
Figure 2A:
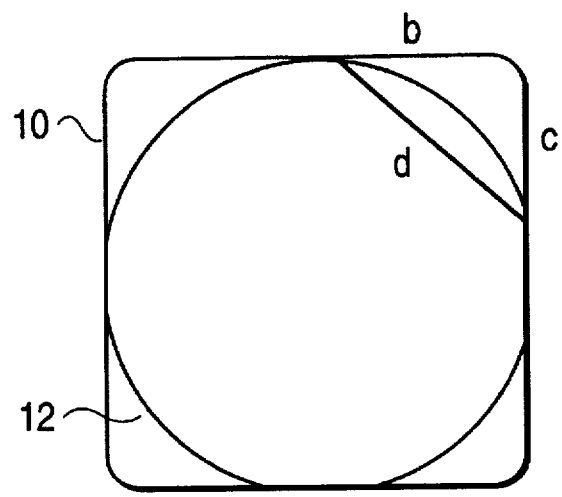
FIGS. 2A–2B show the concept of corner-rounding and one attempt to compensate for it.
Figure 2B:
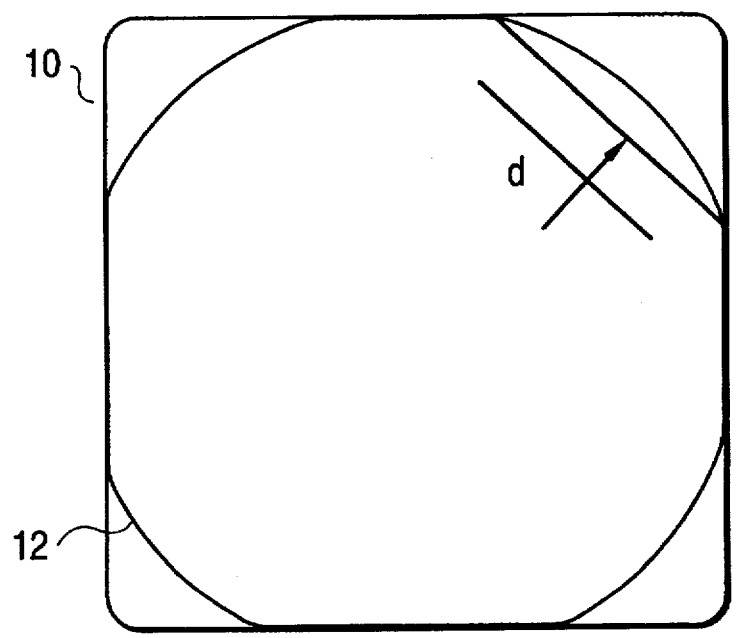
Figure 3A:
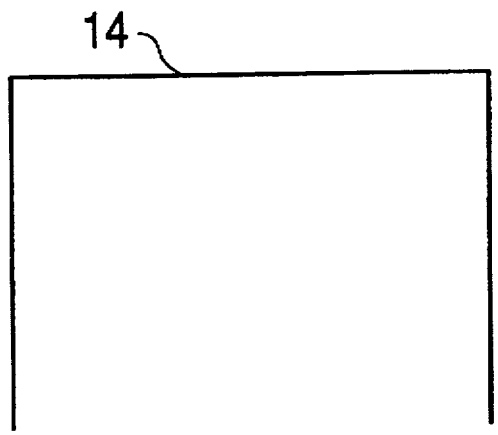
FIGS. 3A–3B show a type of prior art attempt to correct corner rounding.
Figure 3B:
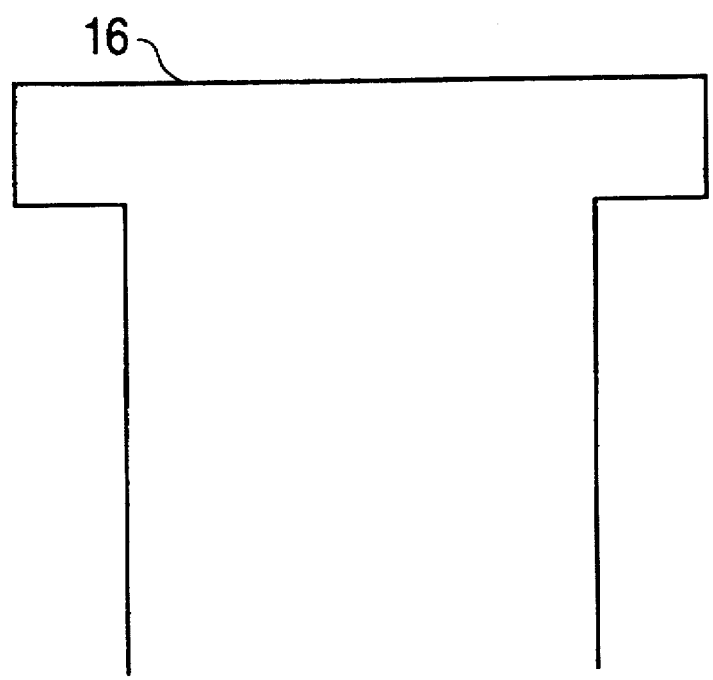
Figure 4A:
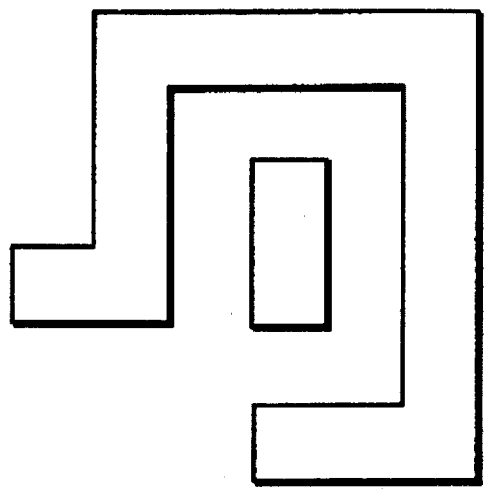
FIGS. 4A–4B show another type of prior art attempt to correct corner rounding in complex circuit designs.
Figure 4B:
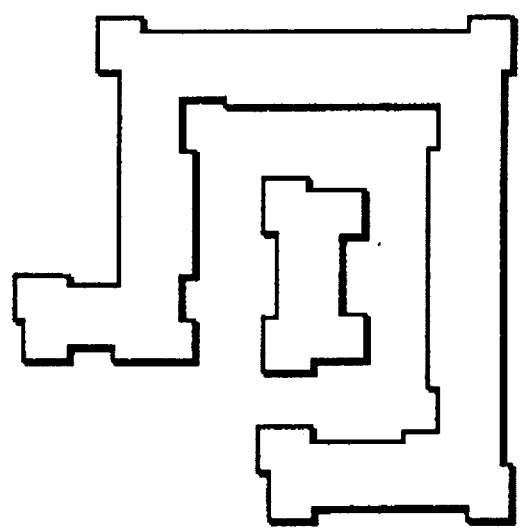
Figure 5A:
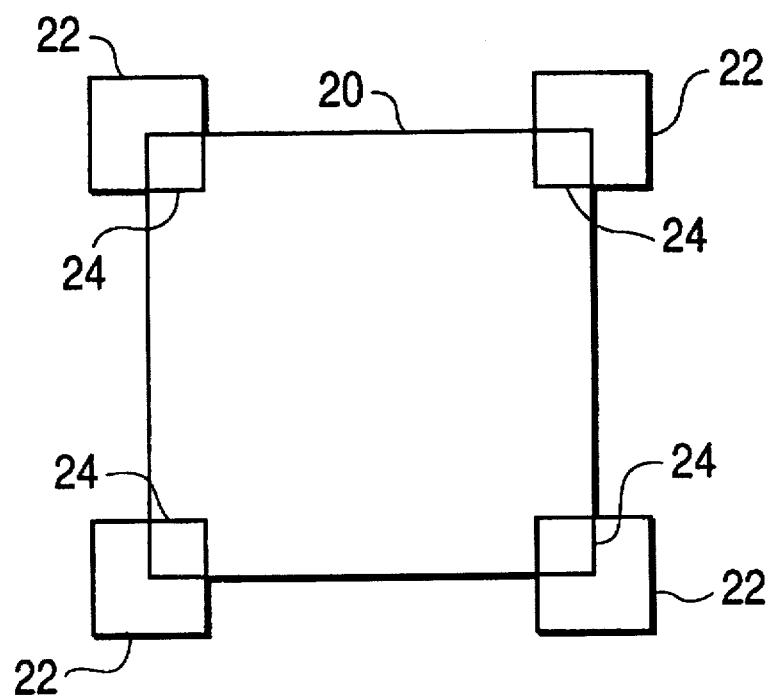
FIGS. 5A–5B show the placement of serifs in accordance with the present invention.
Figure 5B:
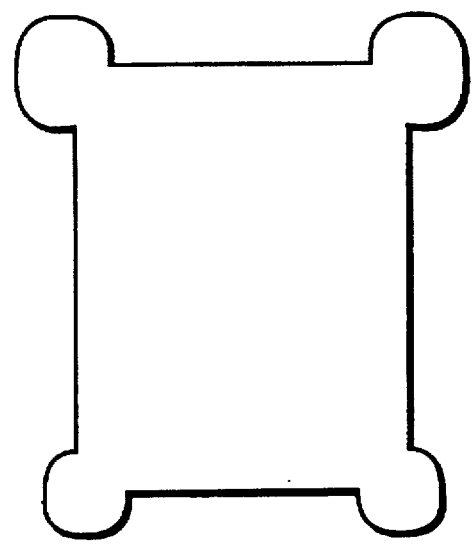

FIGS. 5A–5B illustrate the concept of the present invention. In FIG. 5A, the circuit mask pattern 20 is depicted as a square. Serifs 22 are located on each corner of the mask pattern. The shaded portions 24 of the serifs 22 overlap with the corners of the mask pattern 20. As depicted in FIG. 5A, the shaded portions 24 of the serifs that overlap the corners of the mask pattern 20 are about 33 to about 40 percent the total surface area of the serifs 22.

It has been determined that the critical factors in achieving maximum serif effectiveness are the overall size of the serif (which is dictated by the resolution of the exposure tool), and the amount by which the serifs overlap with the corners of the mask pattern. If the design rules disclosed in the present invention are followed, the shape of the serif is not important.

Thus, the present invention presents a major advantage to mask makers. As stated above, it is very difficult to implement square-shaped serifs on a mask, particularly when the dimensions of the serif are in the sub-micron level. Because the shape of the serifs is not important to the present invention, the serifs may be more easily designed into mask patterns. This advantage therefore saves the circuit designer time and money with respect to mask creation. FIG. 5B depicts a realistic drawing of a serif-corrected mask in accordance with the present invention.

Figure 6A:
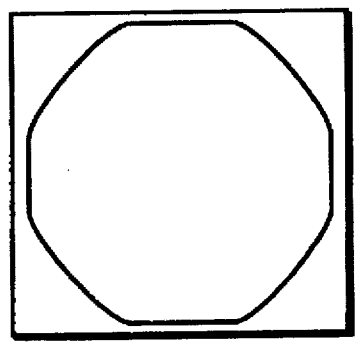
FIGS. 6A–6B show the pictorial results of a test using the serifs of the present invention.
Figure 6B:
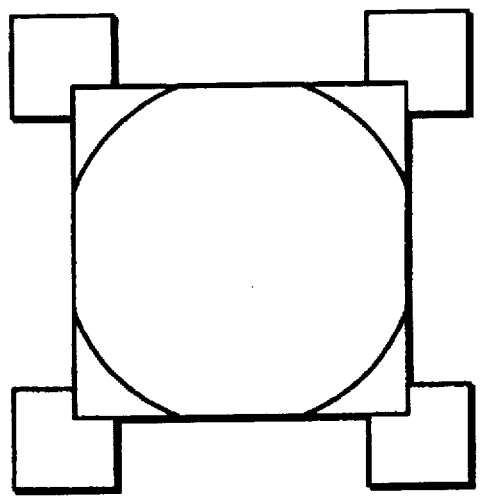

The present invention provides a marked improvement in creating photoresist patterns. This improvement was quantified running the following test. A mercury I-line wave length (365 nanometer) exposure tool was used having a numerical aperture at 0.60 with a quadrupole, off-axis illumination. The focus setting was at 0 microns. Using a commercial I-line photoresist process, the critical dimension for the tested design was set at 0.5 microns. The dimension was measured at 80 percent resist depth. Thus, the expected square contact area was 0.25 square microns. When the test was run without serif correction, the actual contact area was 0.187 square microns, an error of 25.2 percent. When the test was run with the serifs in accordance with the present invention, however, the actual contact area was 0.215 square microns, an error of only 14 percent. FIGS. 6A and 6B depict the results of this test, where FIG. 6A shows the uncorrected actual contact area and FIG. 6B shows the serif-corrected actual contact area.

A second test was also performed, and the results again show the advantages of the present invention. In this test, a mercury I-line wave length exposure tool was used having a numerical aperture at 0.54 with a coherence ratio of 0.52. The focus setting was at −0.2 microns from the optimum. Using a commercial I-line photoresist process, the critical dimension for the tested design was set at 0.5 microns. The dimension was measured at 80 percent resist depth.

Tables 1 and 2, below, show the results of this test. Table 1 shows the results when serifs were not employed. Table 2 shows the results using serifs in accordance with the present invention.

TABLE 1

| Un-corrected feature intersection type | Diagonal corner dimension | | | | Adjacent corner dimension | | | | Corner to the adjacent line edge | | | |
|---|---|---|---|---|---|---|---|---|---|---|---|---|
| | designed | actual | Delta | % error | designed | actual | Delta | % error | designed | actual | Delta | % error |
| (1) "L" intersection | 0.707 | 0.683 | −0.024 | −3.39 | 0.5 | NA | | | 0.5 | 0.556 | 0.056 | 11.20 |
| (2) "T" intersection | 0.707 | NA | | | 0.5 | 0.632 | 0.132 | 26.40 | 0.5 | 0.641 | 0.141 | 28.20 |
| (3) "+" intersection | 0.707 | 0.92 | 0.213 | 30.13 | 0.5 | 0.74 | 0.24 | 48.00 | 0.5 | NA | | |

TABLE 2

| Corrected feature intersection type | Diagonal corner dimension | | | | Adjacent corner dimension | | | | Corner to the adjacent line edge | | | |
|---|---|---|---|---|---|---|---|---|---|---|---|---|
| | designed | actual | Delta | % error | designed | actual | Delta | % error | designed | actual | Delta | % error |
| (1) "L" intersection | 0.707 | 0.683 | −0.024 | −3.39 | 0.5 | NA | | | 0.5 | 0.547 | 0.047 | 9.40 |
| (2) "T" intersection | 0.707 | NA | | | 0.5 | 0.534 | 0.034 | 6.80 | 0.5 | 0.524 | 0.024 | 4.80 |
| (3) "+" intersection | 0.707 | 0.728 | 0.021 | 2.97 | 0.5 | 0.541 | 0.041 | 8.20 | 0.5 | NA | | |

As can be seen from the above data, the present invention provided a marked improvement over uncorrected masks. Both the "T" and "+" feature intersections show a dramatic reduction in percentage error. While there is not a percentage error reduction for "L" intersections, this is expected, as an inside corner and outside corner tend to cancel the effects of each other. In all cases, the added serifs of the present invention reduced the percentage error to less than 10 percent.

The present invention presents a major improvement over known serif design techniques. The present invention allows the designer to provide a substantially accurate correspondence between the original circuit design and the final photoresist pattern on the wafer, by significantly reducing the amount of "corner rounding" that normally occurs. The present invention also provides a specific set of rules for mask designers regarding the optimal placement of serifs. The rules are relatively simple and easily adaptable. Moreover, the implementation of the serifs can be done after the circuit design. By using a CAD post-processing algorithm, the serifs may be easily added to the main feature along with other OPC's (optical proximity corrections) such as scattering bars and anti-scattering bars.

A photolithographic mask and a method for improving the lithographic patterning process in the fabrication of semiconductor devices has been disclosed. The invention is characterized by its applicability to all forms of optical lithography, laser and non-laser based deep ultraviolet (UV) lithography, x-ray lithography, as well as particle beam-based lithography. A similar rule may be applied to a "phase-shifted" mask, where applicable. In the foregoing description, numerous specific details were set forth, such as tools, dimensions, material types, etc. in order to provide a thorough understanding of the present invention. It would be obvious to one of ordinary skill in the art that some of these specific details need not be employed to practice the present invention. In other instances, well known processing steps have not been described, in order to avoid obscuring unnecessarily the present invention.

Moreover, the present invention may be embodied in other specific forms without departing from the spirit or essential characteristics thereof. The present embodiments are therefore to be considered in all respects as illustrative and not restrictive, the scope of the invention being indicated by the appended claims rather than the foregoing description, and all changes which come within the meaning and range of equivalency of the claims are therefore intended to be embraced therein.

What is claimed is:

1. A method for making a mask for optically transferring a lithographic pattern corresponding to an integrated circuit from said mask onto a semiconductor substrate by use of an optical exposure tool, said method comprising the steps of:
    a. creating said mask having said lithographic pattern corresponding to said integrated circuit, said mask having a plurality of corner regions; and
    b. positioning serifs on the corner regions of said mask, wherein said serifs are positioned such that a predetermined portion of surface area for each of said serifs overlaps the corner regions of said mask.

2. The method of claim 1 wherein said serifs have a predetermined size, said predetermined size being set by a resolution value of said optical exposure tool.

3. The method of claim 2 wherein said predetermined size of said serifs is about one-third the resolution value of said optical exposure tool.

4. The method of claim 1 wherein the predetermined portion of surface area for each of said serifs is about 33 to about 40 percent.

5. The method of claim 4 wherein said serifs have a predetermined size, said predetermined size being set by a resolution value of said optical exposure tool.

6. The method of claim 5 wherein said predetermined size of said serifs is about one-third the resolution value of said optical exposure tool.

7. A method for making a mask for optically transferring a lithographic pattern corresponding to an integrated circuit from said mask onto a semiconductor substrate by use of an optical exposure tool, said method comprising the steps of:
    a. creating said mask having said lithographic pattern corresponding to said integrated circuit, said mask having a plurality of corner regions;
    b. determining a resolution limit of said optical exposure tool;
    c. creating serifs having a size determined by the resolution limit of said optical exposure tool; and
    d. positioning said serifs on the corner regions of said mask,
    wherein said serifs are positioned such that a predetermined portion of surface area for each of said serifs overlaps the corner regions of said mask.

8. The method of claim 7 wherein the size of said serifs is about one-third the resolution limit of said optical exposure tool.

9. The method of claim 7 wherein the predetermined portion of surface area for each of said serifs is about 33 to about 40 percent.

10. The method of claim 9 wherein the size of said serifs is about one-third the resolution limit of said optical exposure tool.

11. A photolithography mask having a plurality of corner regions for optically transferring a lithographic pattern corresponding to an integrated circuit from said mask onto a semiconductor substrate by use of an optical exposure tool, said mask comprising a plurality of serifs of a size determined by a resolution limit of said optical exposure tool, said serifs being positioned on said corner regions of said mask such that a predetermined portion of surface area for each of said serifs overlaps the corner regions of said mask.

12. The photolithography mask of claim 11 wherein the size of said serifs is about one-third the resolution limit of said optical exposure tool.

13. The photolithography mask of claim 11 wherein the predetermined portion of surface area for each of said serifs is about 33 to about 40 percent.

14. The photolithography mask of claim 13 wherein the size of said serifs is about one-third the resolution limit of said optical exposure tool.

15. An integrated circuit on a semiconductor substrate made by the method of:
   a. creating a photolithography mask having a lithographic pattern corresponding to said integrated circuit, said mask having a plurality of corner regions;
   b. determining a resolution limit of an optical exposure tool used in transferring the lithographic pattern of said mask to said semiconductor substrate;
   c. creating serifs having a size determined by the resolution limit of said optical exposure tool; and
   d. positioning said serifs on the corner regions of said mask,
   wherein said serifs are positioned such that a predetermined portion of surface area for each of said serifs overlaps the corner regions of said mask.

16. The integrated circuit of claim 15 wherein the size of said serifs is about one-third the resolution limit of said optical exposure tool.

17. The integrated circuit of claim 15 wherein the predetermined portion of surface area for each of said serifs is about 33 to about 40 percent.

18. The integrated circuit of claim 17 wherein the size of said serifs is about one-third the resolution limit of said optical exposure tool.

* * * * *